(12) United States Patent
Marchisi

(10) Patent No.: US 9,997,438 B2
(45) Date of Patent: Jun. 12, 2018

(54) LEADS FRAMES WITH CROSSING LEADS

(71) Applicant: STMicroelectronics S.r.l., Agrate Brianza (IT)

(72) Inventor: Fabio Marchisi, Peschiera Borromeo Milano (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days. days.

(21) Appl. No.: 15/631,579

(22) Filed: Jun. 23, 2017

(65) Prior Publication Data

US 2017/0294370 A1 Oct. 12, 2017

Related U.S. Application Data

(63) Continuation of application No. 14/969,481, filed on Dec. 15, 2015.

(30) Foreign Application Priority Data

Apr. 24, 2015 (IT) .............................. TO2015A0231

(51) Int. Cl.
| | |
|---|---|
| *H01L 23/495* | (2006.01) |
| *H01L 21/00* | (2006.01) |
| *H05K 7/18* | (2006.01) |
| *H01L 23/31* | (2006.01) |

(Continued)

(52) U.S. Cl.
CPC .... *H01L 23/49537* (2013.01); *H01L 21/4821* (2013.01); *H01L 23/3107* (2013.01); *H01L 23/3114* (2013.01); *H01L 23/4952* (2013.01); *H01L 23/49503* (2013.01); *H01L 23/49541* (2013.01); *H01L 23/49548* (2013.01); *H01L 23/49558* (2013.01); *H01L 23/49582* (2013.01);
(Continued)

(58) Field of Classification Search
CPC ........... H01L 23/3114; H01L 23/49503; H01L 23/4952; H01L 23/49548; H01L 21/4821; H01L 21/56; H01L 23/3107; H01L 23/49537; H01L 23/49541; H01L 23/49558; H01L 23/49582; H01L 24/49
See application file for complete search history.

(56) References Cited

U.S. PATENT DOCUMENTS

| | | |
|---|---|---|
| 4,937,656 A | 6/1990 | Kohara |
| 5,250,839 A | 10/1993 | Katoh et al. |
| 5,451,812 A | 9/1995 | Gomi |

(Continued)

FOREIGN PATENT DOCUMENTS

JP H05235245 9/1993

*Primary Examiner* — Alonzo Chambliss
(74) *Attorney, Agent, or Firm* — Slater Matsil, LLP

(57) ABSTRACT

An electronic component, in one embodiment, includes a semiconductor die, a die pad supporting the semiconductor die, and a plurality of leads that include a first set of metal lines and a second set of metal lines. The first set of metal lines cross over the second set of metal lines at crossings. The first set of metal lines is separated by a molding compound from the second set of metal line at the crossings. The first set of metal lines is in a same first plane parallel to the semiconductor die. Each of the second set of metal lines include a first portion oriented along the first set of metal lines and disposed in the first plane, and a second portion offset from the first portion. A plurality of electrical connections couple the semiconductor die to the plurality of leads.

25 Claims, 3 Drawing Sheets

(51) Int. Cl.
*H01L 23/00* (2006.01)
*H01L 21/48* (2006.01)

(52) U.S. Cl.
CPC .... *H01L 24/49* (2013.01); *H01L 2224/49109* (2013.01)

(56) References Cited

U.S. PATENT DOCUMENTS

| | | |
|---|---|---|
| 5,550,401 A | 8/1996 | Maeda |
| 5,751,057 A | 5/1998 | Palagonia |
| 5,780,925 A | 7/1998 | Cipolla et al. |
| 5,864,173 A | 1/1999 | Fogleson |
| 6,030,858 A | 2/2000 | Cha et al. |
| 6,066,515 A | 5/2000 | Schoenfeld |
| 6,307,257 B1 | 10/2001 | Huang et al. |
| 6,462,404 B1 | 10/2002 | Schoenfeld |
| 6,787,889 B2 | 9/2004 | Schoenfeld |
| 7,375,415 B2 | 5/2008 | Lee et al. |
| 7,619,307 B1 | 11/2009 | Wang et al. |
| 7,884,451 B2 | 2/2011 | Sutardja |
| 8,097,495 B2 | 1/2012 | Lee et al. |
| 8,575,742 B1 | 11/2013 | Kim et al. |
| 2003/0067059 A1 | 4/2003 | Corisis |
| 2004/0000702 A1* | 1/2004 | Knapp ............... H01L 23/3107 257/666 |
| 2004/0130010 A1 | 7/2004 | Kuan et al. |
| 2005/0189643 A1* | 9/2005 | Zhou ............... H01L 23/49838 257/690 |
| 2009/0267216 A1 | 10/2009 | Walberg et al. |
| 2010/0001386 A1 | 1/2010 | Misumi et al. |
| 2010/0055895 A1 | 3/2010 | Zafiropoulo et al. |
| 2010/0110654 A1 | 5/2010 | Wang |
| 2014/0231266 A1 | 8/2014 | Sherrer et al. |
| 2014/0252584 A1 | 9/2014 | Spory |
| 2016/0005699 A1 | 1/2016 | Ota et al. |
| 2016/0020182 A1 | 1/2016 | Higgins, III |
| 2016/0181171 A1 | 6/2016 | Spory |

* cited by examiner

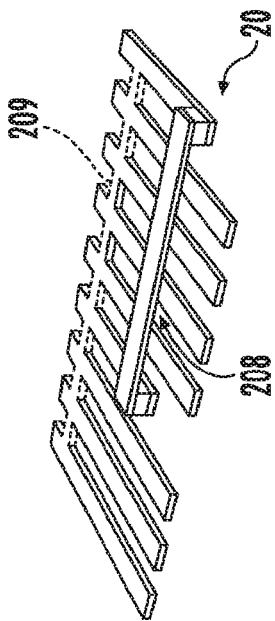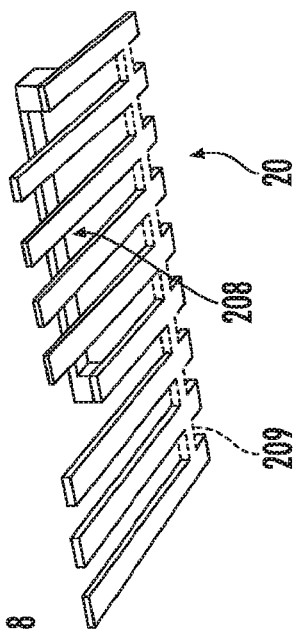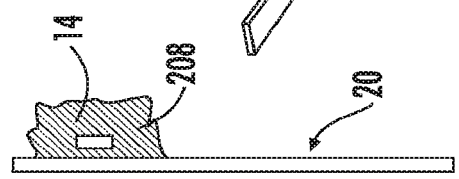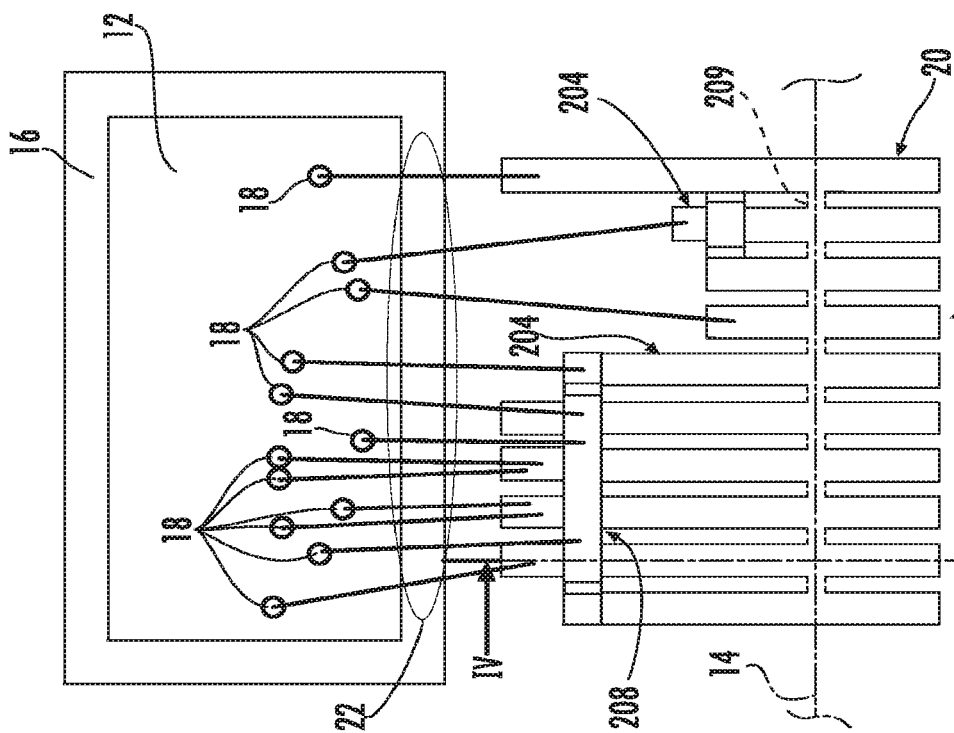

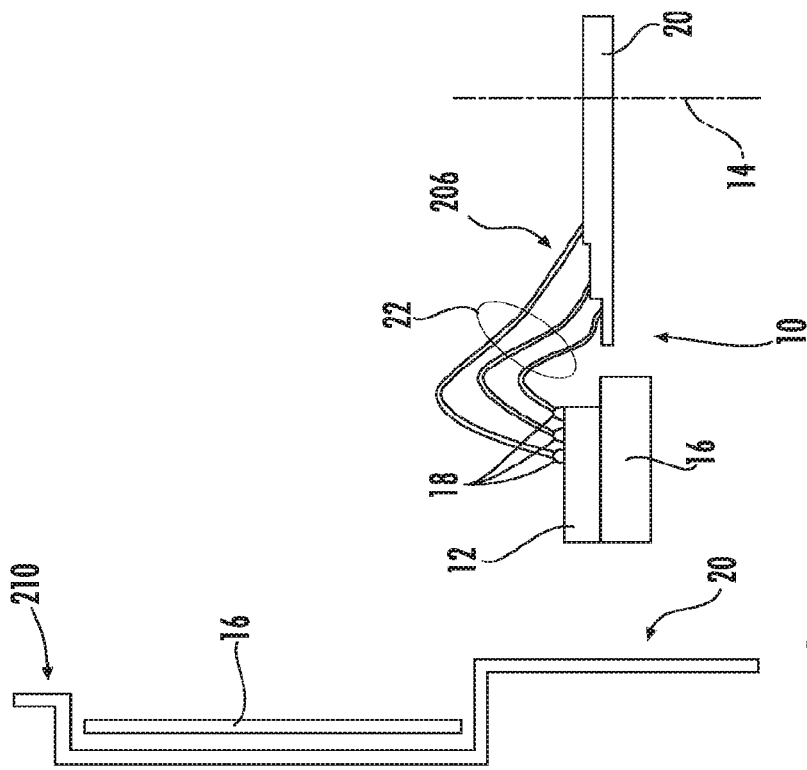
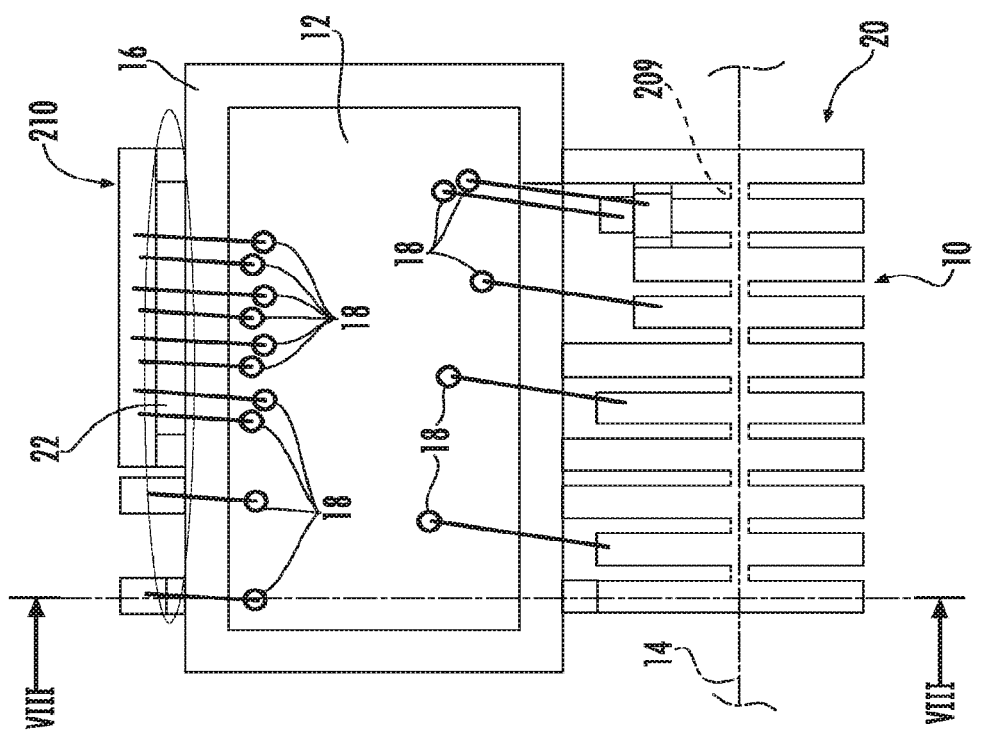
FIG. 7
FIG. 8
FIG. 9

LEADS FRAMES WITH CROSSING LEADS

CROSS-REFERENCE TO RELATED APPLICATIONS

This application is a continuation of U.S. application Ser. No. 14/969,481, filed on Dec. 15, 2015, which claims priority to Italian Application No. TO2015A000231, filed on Apr. 24, 2015, which applications are hereby incorporated herein by reference.

TECHNICAL FIELD

The description relates to electronic components, and more particularly, to producing so-called lead frames in electronic components such as e.g., integrated circuits (ICs).

BACKGROUND

Electronic components, such as integrated circuits (ICs), may include one or more electronic circuits (e.g., a chip or "die"). These circuits may be encased in a package and possibly arranged on a die pad. The package may include a plastics or ceramic packaging (e.g., a molding compound or MC) with die pads coupled to pins of the package, with the die sealed within the package and electrically conductive wires (e.g., gold) coupling the pads to the pins.

Such wires were once attached by hand. In present-day technology that task is performed by machines, leading to a lead frame (LF), which is a set of metal leads that extend outside the package/housing to form electrical connection pins for the component.

Lead frames may be produced with a variety of processes. For instance, lead frames may be etched e.g. by photolithographic processes, by using light to transfer a geometric pattern from a photo-mask onto a light-sensitive, chemical "photoresist" layer deposited on a metallic strip. Once developed, the resist layer may be chemically removed from all those areas not affected by the exposure pattern and a photo mask remains on the metal surface to protect locally the strip from the etching action of e.g., an acid flow.

Lead frames may also be stamped by creating a frame design on a strip by the progressive action of plural punches that remove material from the strip by mechanical action.

Producing a routing to allow dedicated pin-out starting from an existing device is difficult with any of those processes.

Such standard technologies do not easily permit leads to be crossed and electrically insulated. Any "signal crossing" may then be managed through wire bonding (which may result in an increase of wire length, wire sweeping and/or reduced wire distance).

Also, the pad layout of the semiconductor (e.g., silicon) may be linked to lead frame design and creating downsets may involve plastic deformation obtained with dedicated tooling.

Production technologies based on material removal (chemical/mechanical) thus impose limitations on lead frame design.

Possible drawbacks of conventional processes for producing lead frames based on chemical/mechanical removal of material may include one or more of the following:

reduced lead frame design flexibility may not permit to adapt the lead configuration to a die with a constrained pad layout;

a device pad layout may be dictated by the desired pad out of the final product and thus require to be customized on that basis;

an existing device may be hardly compatible with different package types, e.g., a die for dual-in-line packages may not be compatible with a single-in-line package;

a dedicated tool may be involved in plastic deformation for each downset of the frame (tie bar, ground ring, power bar);

managing thickness variations in different frame areas may involve milling of a coil with limited design configuration; and controlled and increased lead frame finishing (surface roughness) almost inevitably involves electro plating or etching, selective plating/etching managed through masking.

SUMMARY

One or more embodiments may refer to a corresponding component (e.g., a microelectronic component such as an integrated circuit).

Also, one or more embodiments may refer to a computer program product loadable into the memory of at least one computer configured to drive a 3D printing apparatus and include software code portions for executing the 3D printing steps of the method of one or more embodiments when the product is run on at least one computer. As used herein, reference to such a computer program product is understood as being equivalent to reference to a computer-readable medium containing instructions for controlling the 3D printing apparatus in order to coordinate implementation of the method according to the embodiments. Reference to "at least one computer" is intended to highlight the possibility for the embodiments to be implemented in modular and/or distributed form.

Contrary to conventional processes involving removal of material, one or more embodiments may involve producing a lead frame by an additive process, e.g., electrically conductive material being added, rather than removed by forming a three-dimensional structure of leads having overlapping surfaces with a gap therebetween.

One or more embodiments may rely on the recognition that 3D printing (additive manufacturing or AM) is becoming a common technology, with dimensions, resolution, and pitch becoming increasingly accurate and with small sizes.

In one or more embodiments, a three-dimensional lead structure may be produced having overlapped surfaces with a gap therebetween which provides electrical insulation, possibly after molding the housing without any insulating spacers added.

In one or more embodiments, a final frame with downsets may be created without plastic deformation (e.g., without dedicated tools).

In one or more embodiments, three-dimensional routing may extend compatibility of an existing device with customized pin out as specified by different customers.

One or more embodiments may offer one or more of the following advantages:

frame design may be adapted to complex pad layouts with flexibility comparable to organic substrates (multilayer routing) since 3D routing is obtained through an additive process;

frames with localized surface modifications in terms of density, roughness and/or porosity may be created "natively" to improve e.g., resin adhesion;

frames with localized undercuts may be created natively e.g., to enhance anchoring/adhesion between the package moulding compound and the frame;

a frame may be printed with areas with different thicknesses without constraints, similarly, a power thick slug may be printed as a monolithic part of the frame, thus possibly dispensing with riveting or laser welding; and frame thickness may be differentiated to improve wire-to-wire distance (wire looping).

BRIEF DESCRIPTION OF THE DRAWINGS

One or more embodiments will now be described, purely by way of non-limiting example, with reference to the annexed figures, wherein:

FIG. 3 is a schematic representation of one or more embodiments of a circuit coupled to a lead frame;

FIG. 4 corresponds to a cross-sectional view along line IV-IV of FIG. 3;

FIG. 5 is a perspective view showing certain details of embodiments according to FIGS. 3 and 4;

FIG. 6 is an opposing perspective view to FIG. 5 showing certain details of embodiments according to FIGS. 3 and 4;

FIG. 7 is a schematic representation of one or more embodiments of a circuit coupled to a lead frame;

FIG. 8 corresponds to a cross-sectional view along line VIII-VIII of FIG. 7; and FIG. 9 is an elevational view of a circuit coupled to a lead frame in accordance with one or more embodiments.

Figure 2:
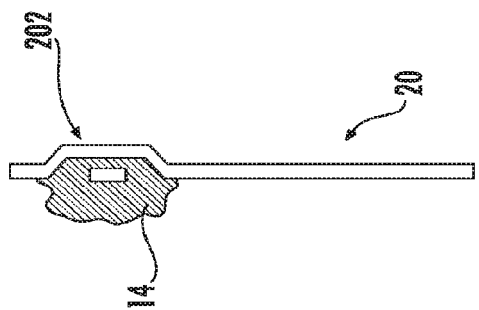
FIG. 2 corresponds to a cross-sectional view along line II-II of FIG. 1.

It will be appreciated that, in order to facilitate understanding the embodiments, the various figures may not be drawn to a same scale.

DETAILED DESCRIPTION OF ILLUSTRATIVE EMBODIMENTS

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments. That is, one or more characteristics exemplifies in connection with a certain figure can be applied to any embodiment as exemplified in any other figure.

The references used herein are provided merely for convenience and hence do not define the scope of protection or the scope of the embodiments.

Throughout the figures, embodiments of an electronic component are generally indicated as 10.

Such embodiments may include an electronic circuit 12, such as chip (or "die") arranged in a package 14. The outline of such a package is schematically indicated in dashed line in FIGS. 1, 3, 8, and 9.

In one or more embodiments, the die 12 may be arranged on a die pad 16, which may be arranged within the package or located at the (e.g., bottom) surface of the package. In one or more embodiments a die pad 16 may not be provided.

In one or more embodiments, the package 14 may include a plastics or ceramic packaging (e.g., a molding compound or MC).

Also, while one chip/die 12 is shown by way of example in the figures, plural chips/dice 12 may be included in the component 10.

Providing electrical contact to the chip(s) 12 may involve connecting die pads 18 to pins 20 of the package, and sealing the die 12 within the package 14, with electrically conductive wires 22 (e.g., gold) connecting the pads 18 to the pins of the lead frame 20.

The wires 22 were once attached by hand. In present-day technology that task is performed by machines, leading to the lead frame 20, that is a set of metal leads (e.g. bars) that may extend outside the package/housing 14 to form the pins.

The designation 3D printing (or additive manufacturing, AM) covers various processes which may be used to produce three-dimensional objects by means of an additive process. In such a process, layers of material may be subsequently laid by way of a "3D printer" which may be regarded as a type of industrial robot. A 3D printing process may be computer-controlled so that an object with a certain shape/geometry may be produced starting e.g., from a data source, that is by way of a computer program product for driving 3D printing apparatus and including software code portions for executing the steps of a 3D printing method when the product is run on such a computer.

The term 3D printing was originally used to designate (only) those processes involving sequential deposition of material e.g., onto a powder bed by means of a printer head essentially resembling an ink-jet printer. The term 3D printing is now currently used to designate a variety of processes including e.g., extrusion or sintering processes. While the term additive manufacturing (AM) may in fact be used in this broader sense, the two designations, 3D printing and additive manufacturing (AM) will be used herein as essentially synonymous.

As used herein, wording such as e.g., "3D printing" and "3D-printed" will therefore designate an additive manufacturing process and an item produced by additive manufacturing.

One or more embodiments may rely on the recognition that, while regarded as an intrinsically "slow" process, recent developments of 3D printing/AM may exhibit—in connection with materials such as copper, aluminium, steel, various metal alloys—parameters which are compatible with producing lead frames of electronic components such as ICs.

One or more embodiments may thus involve producing a set of electrically conductive (e.g., metal) leads comprising the lead frame 20 for a electronic component 10 e.g., by way of 3D printing (additive manufacturing).

The annexed figures are schematic exemplary representations of possible results achievable with 3D printing of a lead frame for an electronic component, which may be by any 3D printing/additive manufacturing process known in the art.

Figure 1:
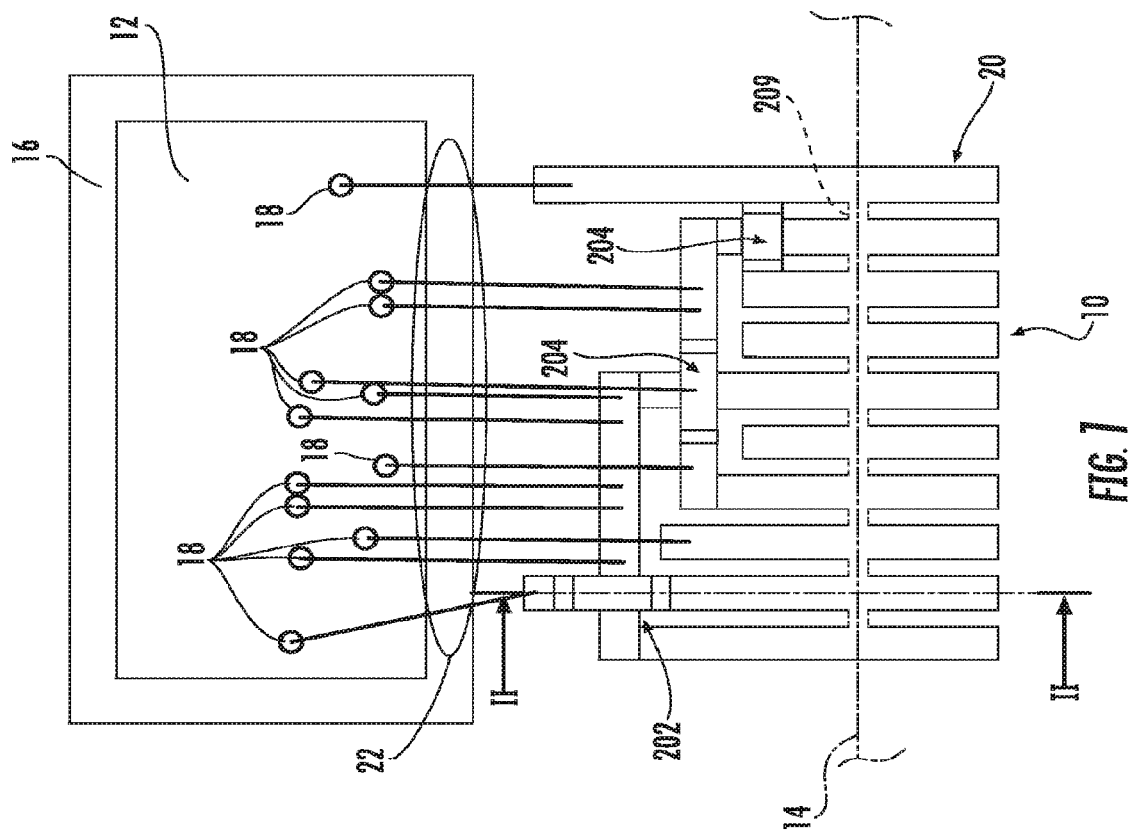
FIG. 1 is a schematic representation of one or more embodiments of a circuit coupled to a lead frame.

In one or more embodiments as exemplified in FIGS. 1 and 2, the lead frame 20 produced by 3D printing may include leads crossing a power bar (e.g., at 202) and/or a power bar crossing other power bar supports (e.g., at 204).

As schematically shown in the cross sectional view of FIG. 2, crossed leads produced with 3D printing may be separated (that is, may have overlapping, e.g., mutually facing, surfaces with a gap therebetween) and thus be electrically insulated with respect to each other, without any dielectric interposer, with an electrically insulating material of the package 14 (e.g., a molding resin) possibly acting as an insulator between the overlapping or facing surfaces. In that way, 3D configurations of leads may be produced with 3D printing without downset tooling.

In one or more embodiments, wire looping may be facilitated by different second bonding heights. That is (as schematically shown by way of example e.g., in FIG. 9) the lead frame 20 produced by 3D printing may include different bonding heights for the wires 22 bonded between the die 12 and the lead frame 20.

One or more embodiments as exemplified in FIGS. 1 and 2 may thus exhibit one or more of the following features as provided by 3D printing:

reduction of the lengths of wires 22, with facilitated adaptation of frame design to pad layout (e.g., at 202);
reduced risk of short circuits between wires 22 and power bars e.g., in wire landing zone (e.g. 202);
possibility of connecting crossed power bars to alternated leads (e.g., 204);
wire looping optimization made possible by modifying second bond height (e.g. 206 and FIG. 9).

The foregoing may also apply to one or more embodiments as exemplified in FIGS. 3 to 6.

FIGS. 3 to 6 exemplify the possibility, provided by 3D printing in one or more embodiments, to have e.g., one power bar crossed to a plurality of leads (e.g., as exemplified at 208 and highlighted in FIGS. 5 and 6).

This again may facilitate wire length reduction due to the possibility of adapting the frame design to the pad layout.

The risk of short circuits between wires and power bars in wire landing zones may again be reduced, and wire looping optimization may again be facilitated by modifying second bond height.

The foregoing may also apply, in addition to embodiments as exemplified in any of FIGS. 1 to 6, also to one or more embodiments as exemplified in FIGS. 7 and 8.

FIGS. 7 and 8 (to which what has been disclosed in connection with FIGS. 1 to 6 may similarly apply) exemplify the possibility, provided by 3D printing in one or more embodiments, to have leads routed under the die 12 (e.g., under the die pad 16) to be bonded with pads on the opposite side of the die 12 as schematically shown at 210.

Once more, this may facilitate wire length reduction due to the possibility of adapting the frame design to the pad layout 12.

Also, 3D routing of lead under the die (pad) may permit to assemble a die for dual-in-line package in a single-in-line package.

It will be appreciated that, for ease of representation, the die 12 is not visible in the cross sectional view of FIG. 8.

It will thus be appreciated that one or more embodiments may involve producing electronic components 10 including at least one circuit 12 having coupled therewith electrical connections 20, 22 including a lead frame 20 of electrically conductive material.

In one or more embodiments the lead frame 20 may be produced by way of a (notionally single-step) additive process, involving the addition of electrically conductive material (e.g., 3D printing) in order to form a three-dimensional structure of leads having overlapping, e.g., mutually facing, surfaces with a gap therebetween.

In certain figures, such as FIG. 1, 3, 5, 6 or 7, the reference number 209 denotes a so-called "dam" bar, shown in dashed line.

In one or more embodiments the dam bar 209 may be formed integral (e.g., one piece) with the rest of the lead frame 20, e.g., by 3D printing, as a part of a three-dimensional structure by way of an additive process of electrically conductive material.

In various embodiments, the dam bar 209 may be e.g., co-planar with other leads in the lead frame 20.

In one or more embodiments, the bar 209 is intended to act in fact as a dam by exerting a containment action of the material of the package 14 in a molten state when this is molded onto the circuit 10 to provide a package for the circuit 12.

In one or more embodiments, the bar 209 may be formed integral (e.g., one piece) with the rest of the lead frame 20 by a common additive process (e.g., 3D printing) of electrically conductive material and thus undesirably "short circuit" adjacent leads in the lead frame 20. In one or more embodiments, the bar 209 may then be removed, at least partially, e.g., by removing the "bridges" extending between adjacent leads in the lead frame.

The (possibly partial) removal of the dam bar 209 may take place in any manner known in the art e.g., by punching.

FIG. 9, already captioned in the foregoing, further highlights the possibility, provided by additive processes, such as e.g., 3D printing, of having leads with bonding areas differentiated by bonding heights, which may facilitate optimizing wire loops.

In one or more embodiments, any of the (e.g., 3D printed) lead surfaces may be provided with modified configurations such as e.g., roughness, porosity, a sculptured pattern such as e.g., a honeycomb pattern, and so on, in order to improve adhesion between the package 14 (e.g., the molding compound) and the lead frame 20.

One or more embodiments having been adopted in producing an electronic component may be detected e.g., via surface analysis of exposed leads and/or X-Ray analysis of 3D configuration of internal leads.

Without prejudice to the underlying principles, the details and embodiments may vary, even significantly, with respect to what is illustrated herein purely by way of non-limiting example, without thereby departing from the extent of protection. The extent of protection is determined by the claims that follow.

What is claimed is:
1. An electronic component comprising:
a semiconductor die;
a die pad supporting the semiconductor die;
a plurality of leads comprising a first set of metal lines and a second set of metal lines, the first set of metal lines crossing over the second set of metal lines at crossings, the first set of metal lines being separated by a molding compound from the second set of metal line at the crossings,
wherein the first set of metal lines are in a same first plane parallel to the semiconductor die,
wherein each of the second set of metal lines comprise a first portion oriented along the first set of metal lines and disposed in the first plane,
a second portion offset from the first portion; and
a plurality of electrical connections coupling the semiconductor die to the plurality of leads.

2. The electronic component of claim 1, wherein each of the second portion of the second set of metal lines comprise a power bar.

3. The electronic component of claim 1, wherein the plurality of leads comprise a lead routed under the semiconductor die, the lead having one portion in the same first plane as the first set of metal lines and another portion under the semiconductor die and offset from the first plane.

4. The electronic component of claim 1, wherein the plurality of electrical connections comprise a plurality of wires bonded between the semiconductor die and the plurality of leads, and wherein the plurality of electrical connections having different bonding heights for each of the plurality of wires.

5. The electronic component of claim 1, wherein the molding compound surrounds the semiconductor die and the plurality of leads.

6. The electronic component of claim 1, wherein each of the plurality of leads comprises a dam bar configured to contain the molding compound onto the semiconductor die.

7. The electronic component of claim 1, wherein the plurality of leads is formed by 3D printing.

8. The electronic component of claim 1, wherein the die pad and the plurality of leads comprises copper, aluminium, or steel.

9. An electronic component comprising:
a semiconductor die;
a die pad supporting the semiconductor die;
a plurality of leads comprising a first set of metal lines and a second set of metal lines, the first set of metal lines being disposed in a first plane, the second set of metal lines comprising one portion in the same first plane and another portion under the semiconductor die and offset from the first plane, wherein the first set of metal lines comprise a lead having a first contact area, a second contact area, and a third contact area, the first contact area, the second contact area, and the third contact area are at a different height relative to the first plane;
a first bonding wire bonded between the semiconductor die and the first contact area;
a second bonding wire bonded between the semiconductor die and the second contact area; and
a third bonding wire bonded between the semiconductor die and the third contact area, the first bonding wire, the second bonding wire, and the third bonding wire being different in lengths.

10. The electronic component of claim 9, further comprising a molding compound surrounding the semiconductor die and the plurality of leads.

11. The electronic component of claim 10, wherein each of the plurality of leads comprises a dam bar configured to contain the molding compound onto the semiconductor die.

12. The electronic component of claim 10, wherein the plurality of leads comprises localized surface modifications.

13. The electronic component of claim 10, wherein the plurality of leads comprises undercuts configured to provide anchoring between the molding compound and the plurality of leads.

14. The electronic component of claim 9, wherein the plurality of leads is formed by 3D printing.

15. The electronic component of claim 9, wherein the die pad and the plurality of leads comprises copper, aluminium, or steel.

16. An electronic component comprising:
a semiconductor die;
a die pad supporting the semiconductor die;
a plurality of leads comprising a first set of metal lines and a second set of metal lines, the first set of metal lines crossing over the second set of metal lines at crossings, the first set of metal lines being separated by a molding compound from the second set of metal line at the crossings,
wherein the first set of metal lines are in a same first plane parallel to the semiconductor die, wherein the first set of metal lines comprise a lead having a first contact area, a second contact area, and a third contact area, the first contact area, the second contact area, and the third contact area are at a different height relative to the first plane,
wherein each of the second set of metal lines comprise
a first portion oriented along the first set of metal lines and disposed in the first plane,
a second portion offset from the first portion;
a first bonding wire bonded between the semiconductor die and the first contact area;
a second bonding wire bonded between the semiconductor die and the second contact area; and
a third bonding wire bonded between the semiconductor die and the third contact area, the first bonding wire, the second bonding wire, and the third bonding wire being different in lengths.

17. The electronic component of claim 16, further comprising a molding compound surrounding the semiconductor die and the plurality of leads.

18. The electronic component of claim 17, wherein each of the plurality of leads comprises a dam bar configured to contain the molding compound onto the semiconductor die.

19. The electronic component of claim 17, wherein the plurality of leads comprises undercuts configured to provide anchoring between the molding compound and the plurality of leads.

20. The electronic component of claim 16, wherein the plurality of leads is formed by 3D printing.

21. An electronic component comprising:
a semiconductor die;
a die pad supporting the semiconductor die;
a plurality of leads comprising a first set of metal lines and a second set of metal lines,
wherein the first set of metal lines are in a same first plane parallel to the semiconductor die, wherein the first set of metal lines comprise a first section extending towards a side of the semiconductor die and a second section extending along the side of the semiconductor die,
wherein each of the second set of metal lines comprise
a first portion extending towards the side of the semiconductor die and disposed in the first plane,
a second portion offset from the first portion,
a third portion extending towards the side of the semiconductor die and disposed in the first plane; and
a first bonding wire bonded between the semiconductor die and the third portion.

22. The electronic component of claim 21, further comprising a second bonding wire bonded between the semiconductor die and a contact area on the second section of the first set of metal lines.

23. The electronic component of claim 21, wherein each of the second section of the second set of metal lines comprise a power bar.

24. The electronic component of claim 21, further comprising a plurality of bonding wires bonded between the semiconductor die and the plurality of leads, and wherein the plurality of bonding wires having different bonding heights.

25. The electronic component of claim 21, wherein a molding compound surrounds the semiconductor die and the plurality of leads.

\* \* \* \* \*